United States Patent
Watanabe (10) Patent No.: US 7,456,656 B2
(45) Date of Patent: Nov. 25, 2008

(54) SEMICONDUCTOR DEVICE AND METHOD OF MANUFACTURING THE SAME

(75) Inventor: Kenichirou Watanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 65 days.

(21) Appl. No.: 11/398,545

(22) Filed: Apr. 6, 2006

(65) Prior Publication Data

US 2006/0237748 A1    Oct. 26, 2006

(30) Foreign Application Priority Data

Apr. 22, 2005    (JP) ............... 2005-125012

(51) Int. Cl.
*H03K 19/00* (2006.01)
(52) U.S. Cl. .......................... 326/82; 326/16
(58) Field of Classification Search ............. 326/82–87, 326/16
See application file for complete search history.

(56) References Cited

U.S. PATENT DOCUMENTS 6,292,026 B1 * 9/2001 Seki ............................ 326/80

6,335,648 B1 * 1/2002 Matsushita .................. 327/198
2004/0085690 A1 * 5/2004 Ito et al. ...................... 361/18

FOREIGN PATENT DOCUMENTS

JP    7-181230    7/1995
JP    2001-133511    5/2001

* cited by examiner

*Primary Examiner*—Rexford Barnie
*Assistant Examiner*—Thienvu V Tran
(74) *Attorney, Agent, or Firm*—McGinn IP Law Group, PLLC (57) ABSTRACT

A semiconductor device according to an embodiment of the invention includes: at least a first power supply system and a second power supply system; an input/output circuit capable of controlling an current for an input or output signal; a control signal input circuit that is provided to the first power supply system and receives a control signal for controlling a current of the input/output circuit; and a control circuit that is provided to the second power supply system and controls a current of the input/output circuit in accordance with a power supply voltage of the second power supply system.

7 Claims, 5 Drawing Sheets

RELATED ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. In particular, the invention relates to a semiconductor device having plural power supply systems and a method of manufacturing the same.

2. Description of Related Art

As a delivery inspection of an LSI, an IDD test or a logical operational test is executed. In the IDD test, for example, a current that flows between a power supply and a ground is measured through a semiconductor device while all nodes of the semiconductor device are set to a high voltage level. Thus, it is possible to determine whether or not the semiconductor device is defective. For example, if a leak current flows through a transistor, a current amount exceeds a predetermined value, so the transistor is determined to be defective.

Figure 5:
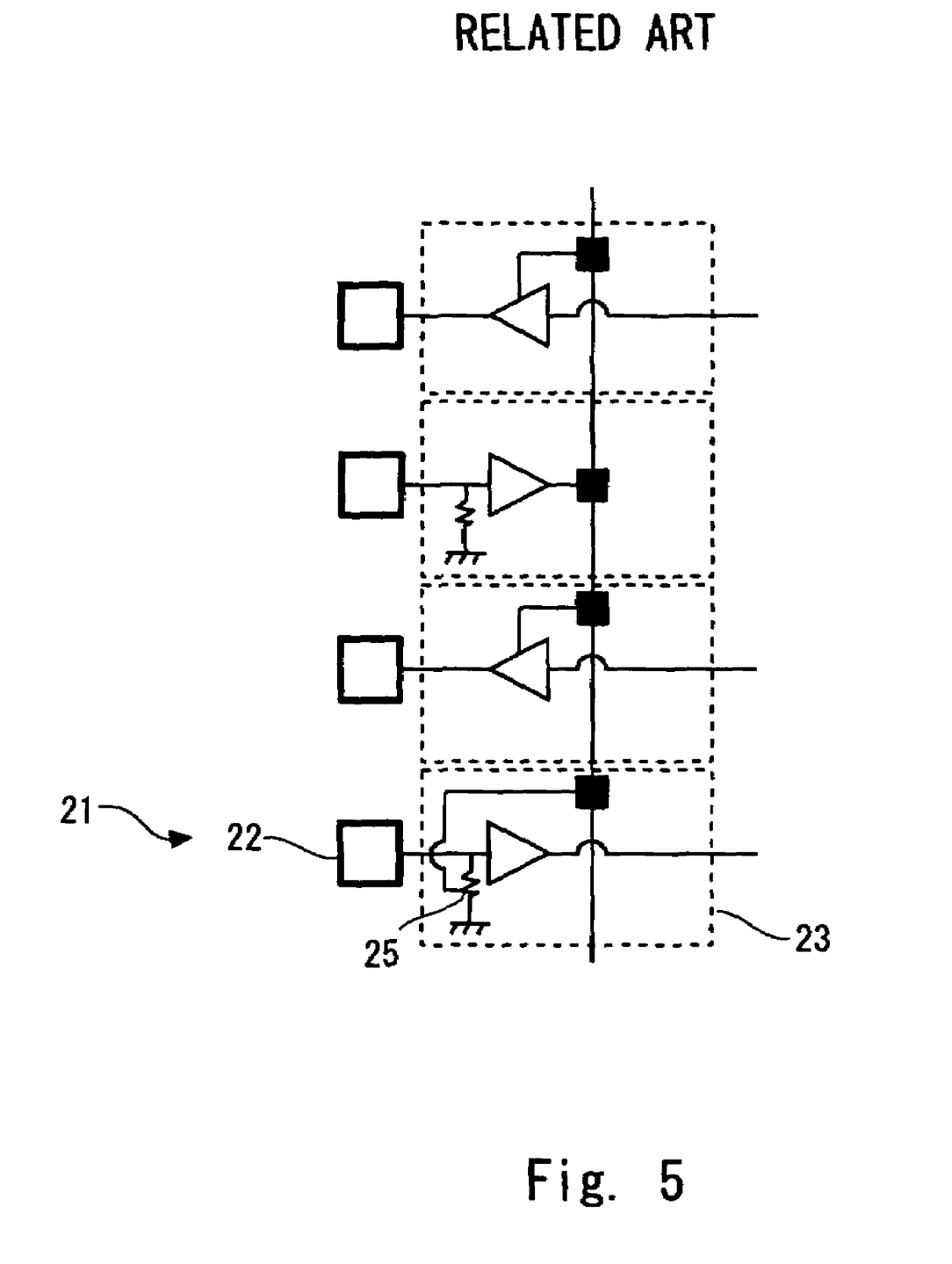
FIG. 5 shows the configuration of an input/output circuit of a conventional semiconductor device.
Figure 6:
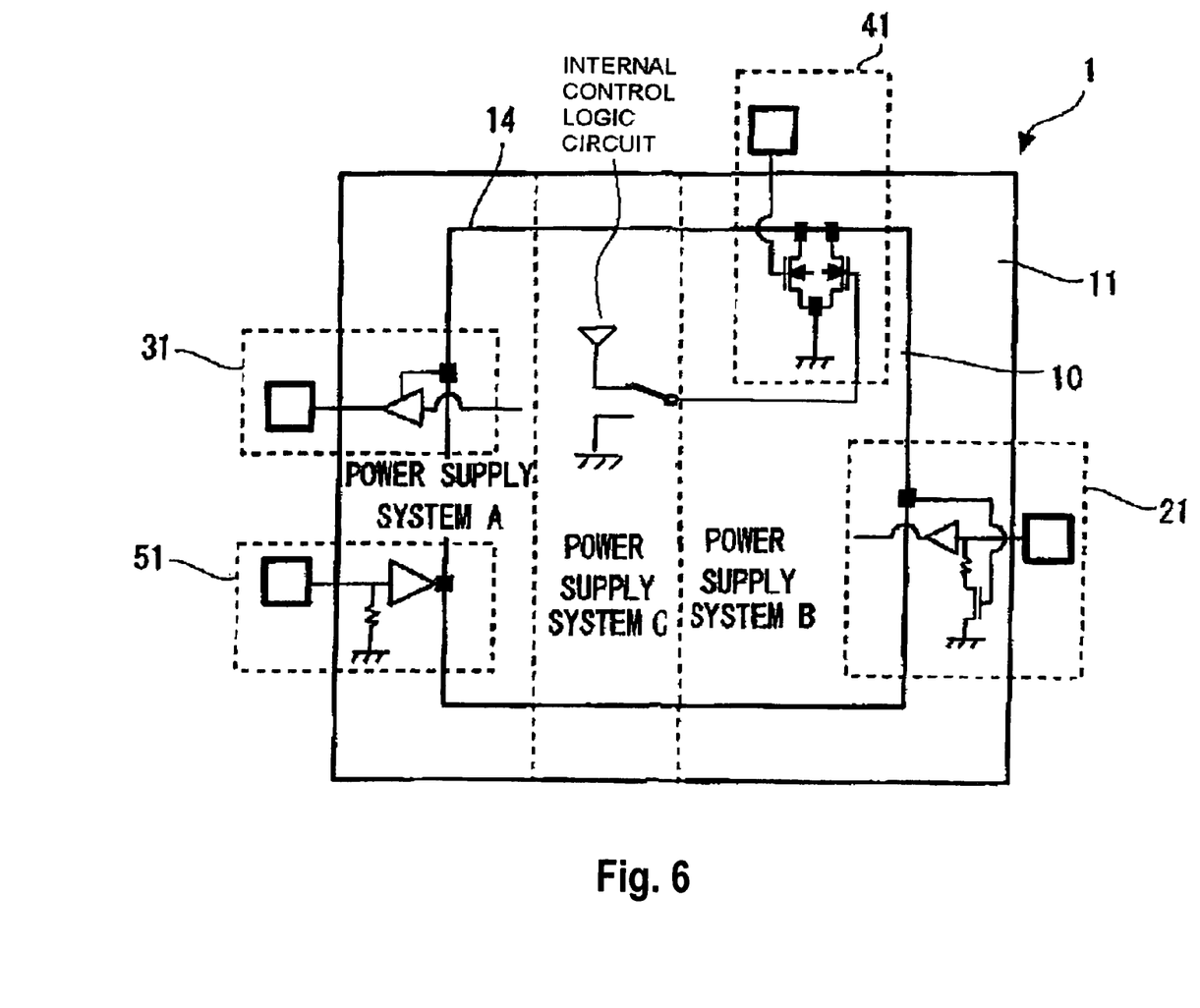
FIG. 6 shows the configuration of a semiconductor device according to an embodiment of the present invention.

Incidentally, a general semiconductor device includes an input/output circuit as an interface circuit, and an inner circuit that receives/transmits signals from/to the input/output circuit. The input/output circuit includes an input buffer connected with an input terminal and an output buffer connected with an output terminal. For example, as shown in FIG. 5, an input buffer circuit 23 uses a pull-down resistor 25 for keeping an input terminal 22 at a low potential. When an IDD of the semiconductor device having the input buffer circuit 23 provided with the pull-down resistor 25 is measured, a current flows from the input terminal 22 to a ground through the pull-down resistor 25, so a measurement value becomes large. In the case of providing the input buffer circuit with a pull-up resistor as well, a measurement value of the IDD test becomes large.

Japanese Unexamined Patent Application Publication No. 2001-133511 discloses a method of measuring an IDD of the semiconductor device having the input buffer circuit provided with the pull-up resistor or pull-down resistor. In the semiconductor device, an operational test control signal common to the input buffer circuit and the output buffer circuit, which have the pull-up resistor or pull-down resistor, is supplied. The operational test control signal is input to a switch connected with the pull-up resistor or pull-down resistor. The operational test control signal is set to a high level (H) during the operational test, and set to a low level (L) during a normal operation. Thus, during the operational test, the pull-up resistor or the pull-down resistor can be separated from a buffer circuit. As described above, pull-up/pull-down control can be executed by inputting an operational test control signal.

Further, Japanese Unexamined Patent Application Publication No. 7-181230 also discloses a method of separating a pull-up or pull-down transistor from an input circuit in a semiconductor device having a multi-power supply system. This publication describes the structure for pull-up/pull-down control of an input/output buffer circuit in an LSI having different power supply systems in the semiconductor device. In the semiconductor device, a buffer circuit provided to one power supply system (referred to as "power supply system A") is controlled by using the other power supply system (referred to as "power supply system B").

Incidentally, in recent years, an increase in standby power consumption due to an off-leak current of a transistor has emerged as a problem. This problem is serious in the field of not only battery-driven mobile device but also digital appliance. In order to save the standby power consumption, for example, plural power supply systems are provided inside the LSI. Thus, a power supply is divided into the plural power supply systems, and a power supply system in a non-operating area is turned off to save the power consumption.

However, in the case of turning off one power supply system, the power supply system B, in the above semiconductor device, there arises a problem in that a buffer circuit of the other system, the power supply system A, is out of control. That is, if the power supply system B is turned off, a control signal cannot be input to the buffer circuit of the power supply system A. Accordingly, if the power supply system for controlling the buffer circuit is turned off in order to save the power consumption during the normal operation, the other power supply system is out of control. As discussed above, in the conventional semiconductor device having plural power supply systems, if one power supply system is turned off, the buffer circuit is out of control.

SUMMARY OF THE INVENTION

A semiconductor device according to an aspect of the present invention includes: at least a first power supply system and a second power supply system; an input/output circuit capable of controlling an current for an input or output signal; a control signal input circuit that is provided to the first power supply system and receives a control signal for controlling a current of the input/output circuit; and a control circuit that is provided to the second power supply system and controls a current of the input/output circuit in accordance with a power supply voltage of the second power supply system. Accordingly, even in the case of turning off the first power supply system, the input/output circuit can be controlled in accordance with the control signal from the control circuit connected with the second power supply system. Hence, the input/output circuit can be reliably controlled, and an operation can be stabilized. Further, during the operational test such as the IDD test, a current of the input/output circuit can be controlled in accordance with the control signal from the control signal input circuit, and the operational test can be reliably performed.

According to another aspect of the invention, a method of manufacturing a semiconductor device including a first power supply system and a second power supply system includes: inputting a control signal of a first level from a control signal input circuit provided to the first power supply system to an input/output circuit capable of controlling a current for an input or output signal; executing an operational test while controlling a current of the input/output circuit in accordance with control signal of the first level; determining whether the semiconductor device is defective or non-defective based on the operational test; and connecting an external line to the control signal input circuit and a control circuit provided to the second power supply system such that the control signal is set to a second level for the semiconductor device determined to be non-defective. Hence, during the operational test such as the IDD test, the input/output circuit can be controlled in accordance with a control signal from the control signal input circuit. Thus, the operational test can be accurately executed. Further, during the normal operation, in accordance with the control signal from the control circuit provided to the second power supply system, the input/output circuit is controlled. Thus, even if the first power supply system is turned off, a current of the input/output circuit can be reliably controlled. Hence, the operation can be stabilized.

According to the present invention, it is possible to provide a semiconductor device capable of stable control even in the case of independently controlling plural power supply systems, and a method of manufacturing the same.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an embodiment of the present invention is explained. The following description is given for explaining the embodiment of the present invention, and the present invention is not limited to the following embodiment. For ease of illustration, the following description is appropriately omitted or simplified. Further, those skilled in the art would easily perform change, addition, and replacement of components of the following embodiment within the scope of the present invention. Incidentally, throughout the accompanying drawings, the same components are denoted by like reference numerals, and description thereof is omitted if not necessary.

Figure 1:
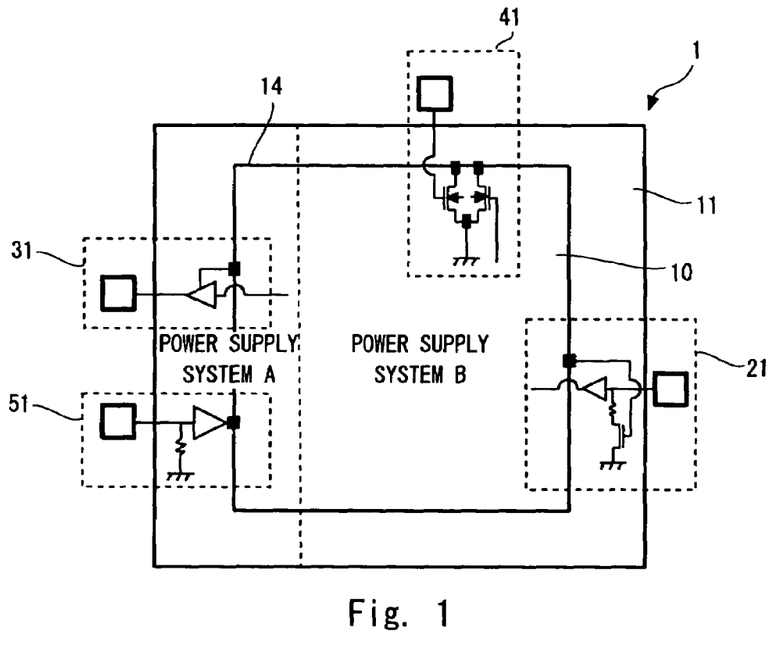
FIG. 1 shows the configuration of a semiconductor device according to an embodiment of the present invention.

The structure of a semiconductor device according to the present invention is described with reference to FIG. 1. A semiconductor device 1 includes an inner circuit 10, and an input/output circuit 11 provided around the inner circuit 10. The input/output circuit 11 serves as an interface to another semiconductor device. That is, the input/output circuit 11 is connected with an external line. The inner circuit 10 and the input/output circuit 11 are separated into a first power supply system A and a second power supply system B. That is, a power is supplied to the first power supply system A and the second power supply system B, whereby the entire semiconductor device 1 operates. On the other hand, in the case of supplying a power to the first power supply system A or second power supply system B, only a part of the semiconductor device 1 operates. It is assumed here that in the case of supplying a power to the first power supply system A, a circuit portion on the left side across the dotted line of FIG. 1 operates; in the case of supplying a power to the second power supply system B, a circuit portion on the right side across the dotted line of FIG. 1 operates. The first power supply system A and the second power supply system B are applied with a power supply voltage and a ground potential, respectively.

Then, the first power supply system A and the second power supply system B can be independently turned on/off under control. That is, one of the first power supply system A and the second power supply system B can be turned on, and the other can be turned off in accordance with the control of an external device. The power supply voltage of the first power supply system A is different from the power supply voltage of the second power supply system B.

The input/output circuit 11 includes plural input circuits 21 and output circuits 31. An input signal is input to the inner circuit 10 through the input circuits 21 provided to the input/output circuit 11. The inner circuit 10 is provided with, for example, a number of logical circuits. Then, the inner circuit 10 executes a predetermined process in accordance with the circuit configuration. The inner circuit 10 sends an output signal to the output circuits 31 in the input/output circuit 11. Incidentally, FIG. 1 shows only one input circuit 21 and one output circuit 31. However, the actual semiconductor circuit 1 includes the plural input circuits 21 and the plural output circuits 31 for each power supply system. That is, the plural input circuits 21 and the plural output circuits 31 are provided for each of the first power supply system A and the second power supply system B. The input circuit 21 and the output circuit 31 are connected with a control line 14 for transmitting a control signal. The control line 14 goes around inside of the semiconductor device 1. That is, a control signal is input to the input circuits 21 and the output circuits 31 through the control line 14 wired in a ring shape. The control line is formed at on the outer periphery of the semiconductor device.

In the semiconductor device according to the present invention, during the operational test such as the IDD test, the control signal is set to the power supply voltage level (H). Hence, all of the input circuits 21 and the output circuits 31 are put into an operational test mode. Accordingly, the pull-up F resistor and the pull-down resistor provided in the input circuits 21 are separated. Whether the device is defective or non-defective is determined based on the result of operational test. The input/output circuit 11 of the semiconductor device of the passed semiconductor device is connected with an external line. Meanwhile, during the normal operation after the external line is connected, the control signal is set to a ground level (L). Thus, all of the input circuits 21 and the output circuits 31 are put into the normal operational mode. The pull-up resistor and the pull-down resistor are thus connected to allow the normal operation. This processing is described below.

The input/output circuit 11 further includes a control circuit 41 and a control signal input circuit 51. The control signal input circuit 51 is connected with the control line 14. During the operational test, the control signal is kept at H in accordance with the input signal that is input through the control signal input circuit 51. On the other hand, the control circuit 41 sets the control signal to L during the normal operation. The control signal input circuit 51 is provided in the first power supply system A, and the control circuit 41 is provided in the second power supply system B. That is, the control circuit 41 and the control signal input circuit 51 are provided in different power supply systems. The control line 14 connects between the control circuit 41 and the control signal input circuit 51.

Figure 2:
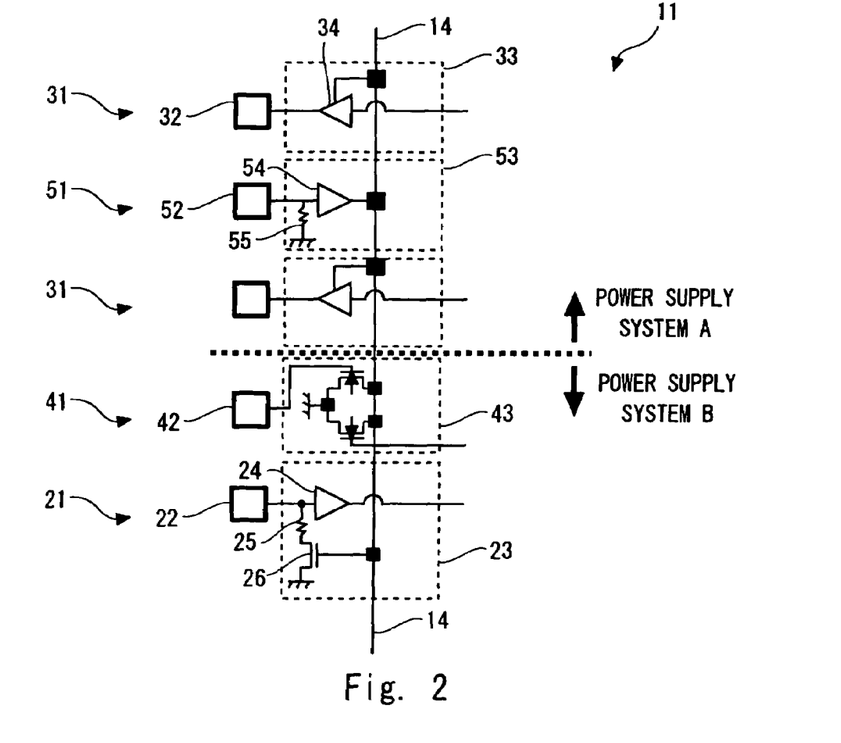
FIG. 2 shows the configuration of an input/output circuit of the semiconductor device according to the embodiment of the present invention.

Next, the configuration of the input/output circuit 11 is described with reference to FIG. 2. FIG. 2 shows the configuration of the input/output circuit 11, and demonstrates the partial configuration of the input/output circuit 11. FIG. 2 shows, as the partial configuration of the input/output circuit 11, the output circuit 31, the control signal input circuit 51, the output circuit 31, the control circuit 41, and the input circuit 21.

The input circuit 21 provided in the second power supply system B includes the input terminal 22 provided on the outer periphery of the semiconductor device 1 and the input buffer circuit 23 provided on the inner circuit 10 side. The input buffer circuit 23 is provided with an input buffer 24, the pull-down resistor 25, and a transistor 26. An input signal that is input through the input terminal 22 is input to the inner circuit 10 through the input buffer 24. The pull-down resistor 25 is provided on the input side of the input buffer 24, whereby the input signal is securely set to the ground level. The transistor 26 is series-connected with the pull-down resistor 25. The transistor 26 is a switch for controlling the pull-down connection of the pull-down resistor 25. A gate of the transistor 26 is connected with the control line 14. Accordingly, the transistor 26 is subjected to on/off control in accordance with the control signal. To be specific, when the control signal is at the ground potential (L), the transistor 26 is turned on, and the input terminal 22 is brought into a pull-down state. When the control signal is at the power supply potential (H), the transistor 26 is turned off, and the input terminal 22 is not brought into the pull-down state. During the operational test such as the IDD test, the control signal is kept at H not to bring the input terminal 22 into the pull-down state. Thus, the input circuit 21 is switched to the operational test mode, and the operational test can be accurately executed. Further, since the control signal is kept at L during the normal operation, the transistor 26 is turned on. Hence, the input terminal 22 is brought into the pull-down state, and the circuit enters the normal operation mode. In this way, the pull-down resistor 25 provided between the input terminal 22 and the input buffer 24 is series-connected with the transistor 26, so the pull-down control can be executed. Incidentally, in the foregoing description about the input circuit 21, the pull-down resistor 25 is provided. However, the same control can be applied to the structure including a pull-up resistor. Although not shown in FIG. 2, the input circuit 21 is also provided in the second power supply system B.

The output circuit 31 provided in the first power supply system A includes an output terminal 32 provided on the outer periphery of the semiconductor device 1 and an output buffer circuit 33 provided on the inner circuit 10 side. The output buffer circuit 33 includes an output buffer 34. An output signal from the inner circuit 10 is sent to the output terminal 32 through the output buffer circuit 33. The output buffer 34 is connected with the control line 14. The output buffer 34 is controlled in accordance with the control signal of the control line 14. More specifically, when the control signal is at H, the output buffer 34 is put into the operational test mode; when the control signal is at L, the output buffer 34 is put into the normal operation mode. At the time of the IDD test, the control signal is kept at H, so the operational test can be accurately executed. During the normal operation, the control signal is kept at L, so the output buffer 34 operates. Therefore, during the operational test mode, the semiconductor device is controlled to reduce the output current as compared with the normal mode. The internal logic is normally operated without introducing error due to a power supply noise occurred by a simultaneous operation of the output buffer circuits 33. In this way, the output buffer circuit 33 and the input buffer circuit 23 can be controlled in accordance with the control signal. Although not shown in FIG. 2, the output circuit 31 is also provided in the second power supply system B.

The first power supply system A includes the control signal input circuit 51. The control signal input circuit 51 includes a control signal input terminal 52 provided on the outer periphery of the semiconductor device 1 and a control signal input buffer circuit 53 provided on the control line 14 side. The control signal input buffer circuit 53 includes a control signal input buffer 54 and a pull-down resistor 55. An output of the control signal input buffer 54 is connected with the control line 14. Accordingly, the control signal input to the control signal input terminal 52 is input through the control signal input buffer 54 to the control line 14. During the IDD test, the control signal input terminal 52 is connected with a probe or the like to set the control signal input terminal 52 to H. Thus, the control signal is set to H, and the input circuit 21 and the output circuit 31 can be controlled. During the normal operation, the control signal input terminal 52 is kept at L. The input side of the control signal input buffer 54 is connected with the pull-down resistor 55, so the control signal input terminal 52 can be stably set to L.

Figure 3:
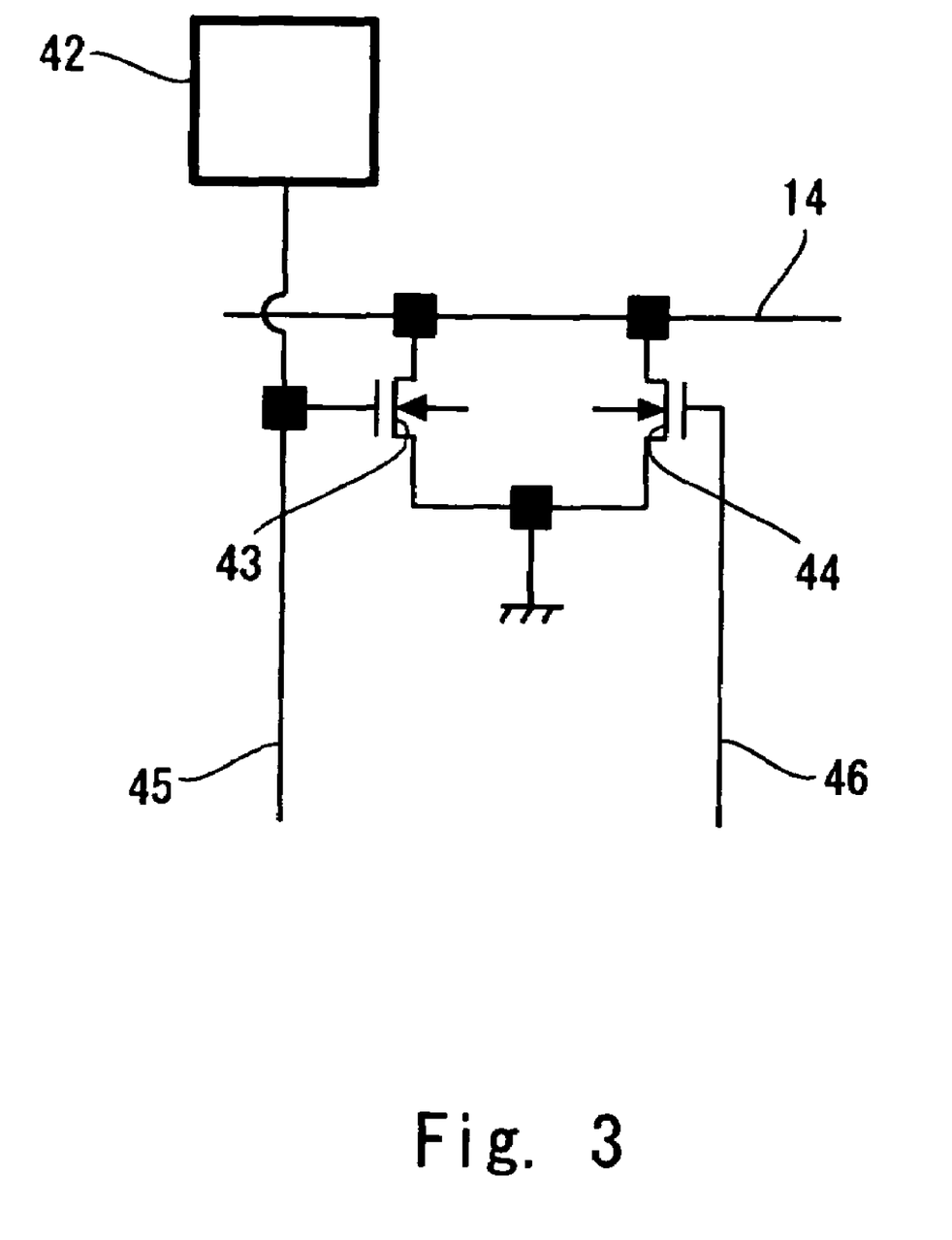
FIG. 3 is a circuit diagram showing the configuration of a control circuit of the semiconductor device according to the embodiment of the present invention.

The second power supply system B includes a control circuit 41. The control circuit 41 can keep the control signal at L even if the first power supply system A is turned off during the normal operation. Referring to FIG. 3, the configuration of the control circuit 41 is described. FIG. 3 is a circuit diagram showing the configuration of the control circuit 41. The control line 14 is grounded by way of two parallel-connected N type MOS transistors 43 and 44. A gate of one transistor, the N type MOS transistor 43 is connected with a power supply terminal 42. The power supply terminal 42 is applied with, for example, a power supply voltage of the second power supply system B. That is, the power supply terminal 42 functions as a power supplying block for supplying power through a power supply line 45. During the normal operation, the power supply voltage is applied through the external line to the power supply terminal 42. Thus, the N type MOS transistor 43 is turned on. Hence, the control line 14 is grounded through the N type MOS transistor 43 in an ON state. The control signal can be thereby kept at L. On the other hand, during the operational test, the power supply terminal 42 is made open. Then, the N type MOS transistor 43 is turned off.

A gate of the other transistor, the N type MOS transistor 44 is connected with an internal signal line 46 for transmitting a signal supplied from the inner circuit 10. During the operational test, the N type MOS transistor 44 is always kept off in accordance with a logical signal from the inner circuit 10. During the operational test, the N type MOS transistor 43 and the N type MOS transistor 44 are thus turned off at all times. Accordingly, during the operational test, the control signal is set to H in accordance with the input of the control signal input circuit 51. The input buffer circuit 23 and the output buffer circuit 33 are put into the operational test mode, and the operational test can be accurately executed. Incidentally, during the operational test, the second power supply system B is applied with the power supply voltage from a terminal different from the power supply terminal 42. Then, it is determine whether the semiconductor device 1 is defective or non-defective based on the measurement result of the operational test. The external line is bonded to the passed semiconductor device 1. To elaborate, the external line is connected with the input terminal 22 of the input circuit 21 and the output terminal 32 of the output circuit 31. Furthermore, the control signal input terminal 52 of the control signal input circuit 51 is connected with the external line to keep the control signal at L. The external line is also connected with the power supply terminal 42 of the control circuit 41.

On the other hand, during the normal operation, the power supply voltage is applied through the external line to the power supply terminal 42. Thus, the N type MOS transistor 43 is turned on, and the control signal is switched to L. As a result, the input buffer circuit 23 and the output buffer circuit 33 are brought into the normal operation mode. The case where the first power supply system A is turned off, and the second power supply system B is turned on is discussed below. When the first power supply system A is turned off, the control signal input terminal 52 of the control signal input circuit 51 is opened. However, the power supply terminal 42 is applied with the power supply voltage of the second power supply system B, so the control circuit 41 keeps the control signal at L. Hence, the input buffer circuit 23 and the output buffer circuit 33 continue the normal operation. Further, the case where the second power supply system B is turned off, and the first power supply system A is turned on is discussed. In this case, in the control circuit 41, the control line 14 is not grounded. However, since the control signal input terminal 52 is set to L, the input buffer circuit 23 and the output buffer circuit 33 continue the normal operation. During the normal operation, even if one of the power supply systems is turned off, the circuit can be controlled to perform the normal operation. Hence, the plural power supply systems can be independently subjected to on/off control, saving the power consumption. Further, the IDD test can be precisely performed with a simple structure.

In this way, the control signal input circuit 51 and the control circuit 41 are provided in different power supply systems, whereby even if one power supply system is turned off during the normal operation, the input/output buffer circuit can be properly controlled. Further, the operational test can be reliably executed on the semiconductor device capable of independently controlling the plural power supply systems by use of the control signal input circuit 51.

Further, the power supply terminal 42 can be also used as a power supply terminal for applying the power supply voltage to the second power supply system B during the normal operation. For example, a switch that operates in accordance with a control signal is arrange between the power supply line 45 and the gate of the N type MOS transistor 43, for example. More specifically, when the control signal is at H, control is executed not to apply the power supply voltage to the gate of the N type MOS transistor 43. Thus, even if the power supply terminal 42 is also used as the power supply terminal of the power supply system, the control signal can be kept at H during the operational test. As a result, the operational test can be executed on the semiconductor device 1 having plural power supply systems without increasing the number of input terminals. Thus, the number of bonding pads can be reduced to realize a simple structure.

Figure 4:
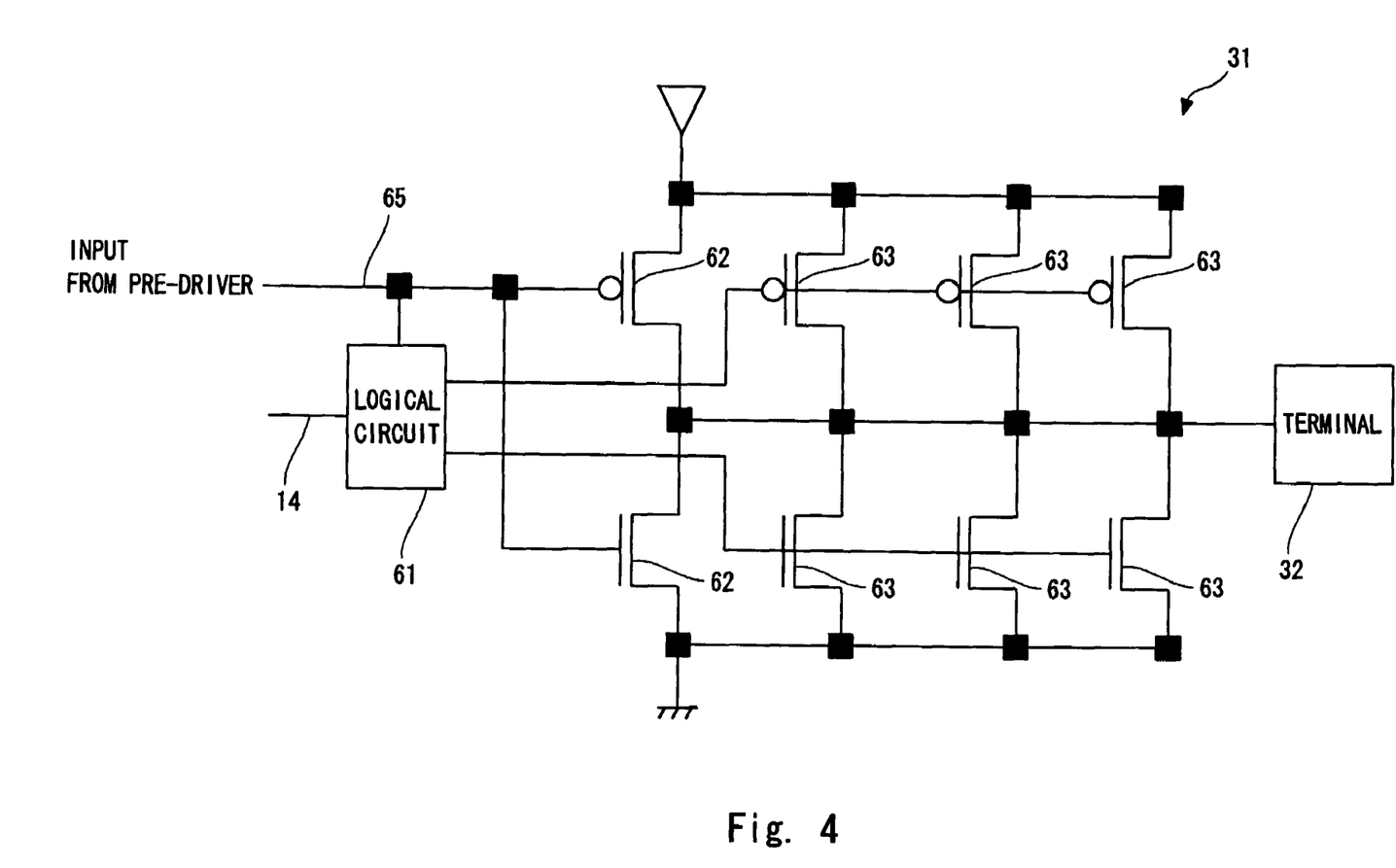
FIG. 4 is a circuit diagram showing the configuration of an output circuit of the semiconductor device according to the embodiment of the present invention.

Incidentally, the above description is focused on the example where the input circuit 21 is controlled in accordance wit the control signal 14, but the present invention is not limited thereto. That is, according to the present invention, the current of the output circuit 31 can be controlled in accordance with the control signal. Referring to FIG. 4, an example of the output circuit 31 subjected to the current control in accordance with the control signal 14 is described. FIG. 4 shows an example of the configuration of the output circuit 31. The output circuit 31 includes a logical circuit 61, two transistors 62, and six transistors 63. The two transistors 62 are connected in series between the power supply voltage and the ground potential. One of the transistors 62 is a Pch transistor, and the other is an Nch transistor. The transistors 63 are also connected in series by twos between the power supply voltage and the ground potential. One of the two series-connected transistors is a Pch transistor, and the other is an Nch transistor. As mentioned above, four pairs of transistors connected in series between the power supply voltage and the ground potential are provided. An input 65 from a pre-driver at the previous stage of the input/output circuit 11 or an output of the logical circuit 61 is supplied to a gate of the transistors 62 and 63. The transistors 62 and transistors 63 are controlled in accordance with the input 65 from the pre-driver at the previous stage of the input/output circuit 11 or the output of the logical circuit 61.

During the operational test, the transistors 62 are turned on, and the transistors 63 are turned off under the control. The logical circuit 61 outputs a signal for controlling the transistors 62 and the transistors 63 in accordance with the control signal 14 kept at H. That is, when the control signal 14 is at H, three pairs of transistors 63 are set to high impedance under the control. On the other hand, during the normal operation, the transistors 62 and the transistors 63 are controlled in accordance with the input 65 from the pre-driver. The logical circuit 61 controls the transistors 62 and the transistors 63 based on the control signal and the input from the pre-driver. When the control signal is at L, in accordance with the input 65 from the pre-driver, the Pch transistors of the transistors 62 and the transistors 63 are similarly controlled. Further, when the control signal is at L, the Nch transistors of the transistors 62 and the transistors 63 are similarly controlled in accordance with the input 65 from the pre-driver. The input 65 from the pre-driver is changed in accordance with the power supply voltage of the power supply system B. Accordingly, the current supplied to an output terminal 32 is controlled based on the input 65 from the pre-driver, that is, the power supply voltage of the power supply system B. Hence, the current of the output circuit 31 is controlled in accordance with the control signal 14. During the operational test, the control is executed in accordance with the control signal 14, so the operational test can be reliably performed. Even during the normal operation, the control signal is set to L by the control circuit 41 or the like, so the operation is stabilized. Incidentally, the above input/output circuit is one example of input/output circuit the current of which is controlled in accordance with the control signal. The present invention is not limited to the illustrated one. That is, the present invention is applicable to an input/output circuit 21 controlled based on the control signal 14.

If an input/output buffer is composed of two kinds of MOS transistors different in oxide film thickness, the power supply voltage is divided into a main buffer voltage and a pre-buffer voltage in many cases. Description is given of the case where the power supply system is further divided into a two-power supply voltage system (first power supply system A and second power supply system B) for driving an input/output buffer circuit pre-buffer and an internal logical cell, and a two-power supply voltage system (third power supply system C and fourth power supply system D) for driving an input/output buffer circuit main buffer. It is assumed here that the first power supply system A includes the control signal input circuit 51, and the fourth power supply system D includes the control circuit 41. That is, the power supply voltage of the fourth power supply system D is applied from the power supply terminal 42 of the control circuit 41. Then, the gate of the N type MOS transistor 44 is assumed to receive the internal signal of the inner circuit 10 that operates through the application of the power supply voltage of the second power supply system B. At this time, the internal signal is, for example, a standby signal that indicates that the other power supply system is not applied with the power supply voltage. The standby signal is transmitted on the internal signal line 46.

In this case, when the first power supply system A, the third power supply system C and the fourth power supply system D are turned off, the control signal input terminal 52 and the power supply terminal 42 are opened. However, the internal logical circuit in the second power supply system B generates a standby signal to set the internal signal line 46 to H. Hence, the N type MOS transistor 44 can be turned on to keep the control signal at L. Accordingly, even if the other power supply system is turned off, the normal operation can be executed. Further, even when the plural power supply systems are independently subjected to the on/off control, the logical circuit of the inner circuit 10 keeps the internal signal line at H, whereby the normal operation can be performed stably.

As described above, the inventor of the present invention focuses on the fact that, during the IDD test, all the power supply systems are kept in an ON state, and during the normal operation where the power supply systems are turned on/off in the complicated manner, the control signal only needs to be set to L. That is, the control circuit 41 having a function of setting the control signal to L is incorporated into the power supplying block other than the power supply system including the control signal input circuit 51. Accordingly, at the time of supplying a power, the control signal is kept at L, and even if the power supply is stopped, the control signal can be kept to L in accordance with the standby signal from the inner circuit 10. Thus, the operational test can be precisely executed on the semiconductor device having the plural power supply systems. This block functions as the power supplying block, so there is not limitation on arrangement in the input/output buffer area. Further, it is only required to provide one control signal input circuit 51 in the semiconductor device 1, so an additional bonding pad as an input terminal is unnecessary. Thus, the number of bonding pads can be reduced, preventing the upsizing of the LSI chip.

As set forth above, according to the present invention, it is possible to execute an operational test on the semiconductor device capable of independently performing on/off control over the plural power supply systems, with the simple structure. Accordingly, the semiconductor device according to the present invention is suitable for a system LSI of mobile device or system appliance. Incidentally, the transistors in the control circuit 41 are not limited to the N type MOS transistor. Further, the pull-down resistor (pull-up resistor) for the input terminal 22 may be an on-resistance of the transistor. In this case, the on-resistance of the transistor switched in accordance with the control signal is used as the pull-down resistor (pull-up resistor), whereby the switch and the pull-down element (pull-up element) can be realized using one transistor. The pull-down circuit (pull-up circuit) can be composed of one transistor, so the number of elements can be reduced.

It is apparent that the present invention is not limited to the above embodiment that may be modified and changed without departing from the scope and spirit of the invention.

What is claimed is:
1. A semiconductor device, comprising:
at least a first power supply system and a second power supply system;
an input/output circuit controlling a current for an input or output signal;
a control signal input circuit provided to the first power supply system and receiving a control signal for controlling a current of the input/output circuit;
a control circuit provided to the second power supply system and controlling a current of the input/output circuit in accordance with a power supply voltage of the second power supply system; and
a control line connected between the control circuit and the control signal input circuit, said control line controlling the current of the input/output circuit, wherein the control circuit keeps the control line at a ground potential during normal operation, and the control signal input circuit keeps the control line at a high potential during an operational test.

2. The semiconductor device according to claim 1, wherein the input/output circuit includes an input circuit having a pull-up resistor or a pull-down resistor that is connected with a switch, and
the current of the input/output circuit is controlled through on/off-control of the switch connected with the pull-up resistor or the pull-down resistor in accordance with the control signal or the power supply voltage of the second power supply system.

3. The semiconductor device according to claim 2, further comprising an inner circuit that is operated by a third power supply system different from the first power supply system and the second power supply system,
wherein the control circuit receives an internal signal from the inner circuit, and the control circuit controls the current of the input/output circuit in accordance with the internal signal.

4. The semiconductor device according to claim 1, further comprising an inner circuit that is operated by a third power supply system different from the first power supply system and the second power supply system,
wherein the control circuit receives an internal signal from the inner circuit, and the control circuit controls the current of the input/output circuit in accordance with the internal signal.

5. The semiconductor device according to claim 1, wherein
a control line for controlling the current of the input/output circuit connects between the control circuit and the control signal input circuit, and
the input/output circuit and the control line is located on an outer periphery of the semiconductor device.

6. The semiconductor device according to claim 5, wherein the control line is wired in a ring shape.

7. The semiconductor device according to claim 1, wherein
a control line is connected to the control circuit and the control signal input circuit;
the control circuit has at least one N type MOS transistor; and
a gate of the N type MOS transistor is connected to a power supply line of the second power supply system, a drain of the N type MOS transistor is connected to the control line, and a source of the N type MOS transistor is connected to a ground line.

* * * * *